United States Patent
Watanabe (10) Patent No.: US 6,566,917 B2
(45) Date of Patent: May 20, 2003

(54) SAMPLING CIRCUIT AND AMPLIFICATION TYPE SOLID-STATE IMAGING DEVICE EMPLOYING THE CIRCUIT

(75) Inventor: Takashi Watanabe, Souraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/957,262

(22) Filed: Sep. 20, 2001

(65) Prior Publication Data

US 2002/0060586 A1 May 23, 2002

(30) Foreign Application Priority Data

Nov. 22, 2000 (JP) ........................................ 2000-356223

(51) Int. Cl.[7] .............................................. G11C 27/02
(52) U.S. Cl. ............................................ 327/94; 327/91
(58) Field of Search ...................................... 327/91–96

(56) References Cited

U.S. PATENT DOCUMENTS

| 5,339,459 A | | 8/1994 | Schiltz et al. ................ 455/333 |
|---|---|---|---|
| 5,341,037 A | * | 8/1994 | Miki et al. ..................... 327/91 |
| 5,721,563 A | * | 2/1998 | Memida ........................ 327/94 |
| 5,959,470 A | | 9/1999 | Sugihashi ..................... 327/94 |

FOREIGN PATENT DOCUMENTS

GB          2351803 A          1/2001

* cited by examiner

Primary Examiner—Kenneth B. Wells
(74) Attorney, Agent, or Firm—Dike, Bronstein, Roberts & Cushman IP Group Edwards & Angell, LLP; David G. Conlin; David A. Tucker (57) ABSTRACT

A sampling circuit includes a first sample hold means having a sample hold switch whose one terminal receives an input signal and a sample hold capacitor whose one terminal is connected to the other terminal of the sample hold switch, an amplifier circuit whose input terminal is connected to the other terminal of the sample hold switch and a horizontal selection switch whose one terminal is connected to an output terminal of the amplifier circuit and the other terminal of which is connected to a horizontal signal line. The output terminal of the amplifier circuit is connected to one terminal of a conduction control switch, and a first constant current load is connected to the other terminal of the conduction control switch. The conduction control switch is turned on when the sample hold switch is on and the horizontal selection switch is off.

4 Claims, 10 Drawing Sheets

Fig.8A $V_{ig}$ PRIOR ART
Fig.8B $\phi_{cl}$ PRIOR ART
Fig.8C $V_{sj}$ PRIOR ART
Fig.8D $\phi_{sl}$ PRIOR ART
Fig.8E $\phi_{Hj}$ PRIOR ART
Fig.8F $\phi_{Hj+1}$ PRIOR ART
Fig.8G $V_{sr}$ PRIOR ART

SAMPLING CIRCUIT AND AMPLIFICATION TYPE SOLID-STATE IMAGING DEVICE EMPLOYING THE CIRCUIT

BACKGROUND OF THE INVENTION

The present invention relates to a sampling circuit and an amplification type solid-state imaging device.

Conventionally, as an amplification type solid-state imaging device that employs a sampling circuit, there has been a known one in which each pixel element is provided with an amplification function for to read an optical reception signal by means of a scanning circuit. In particular, there have been energetically developed APS (Active Pixel Sensor) type image sensors having a CMOS type pixel element construction that is advantageous for the element to be integrated with a peripheral drive circuit and a signal processing circuit. In this APS type image sensor, it is required to form a photoelectric conversion section, an amplification section, a pixel selection section and a reset section within one pixel element, and normally three to four MOS transistors (T) are employed besides the photoelectric conversion section constructed of a photo diode (PD).

Figure 5:
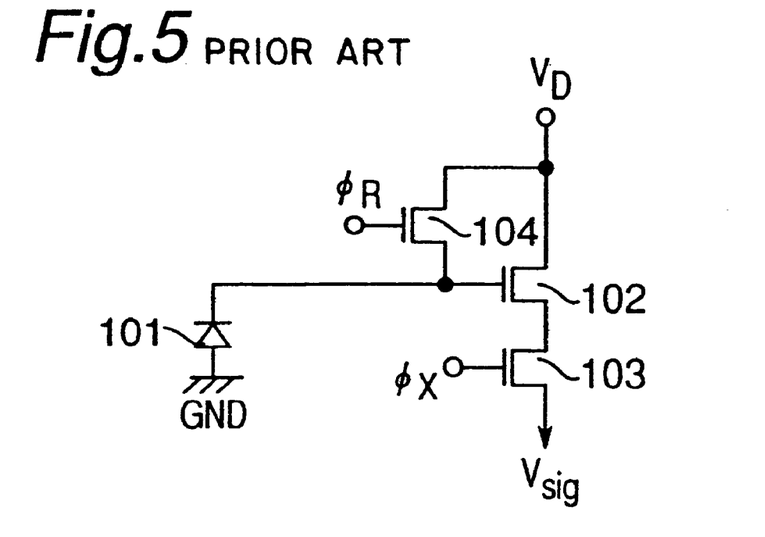
FIG. 5 is a circuit diagram of an amplification type pixel element.

FIG. 5 shows the construction of the pixel element in the case of a PD+3T system. In FIG. 5, signal charges generated in a photoelectric conversion section 101 are converted into a voltage and applied to the gate of a transistor 102. This transistor 102 executes impedance conversion (current amplification), and a signal $V_{sig}$ is read via a pixel selection switch 103 to the gate of which a voltage φx is applied. In the middle of the read period of this signal $V_{sig}$, the potential of the photoelectric conversion section 101 is reset to a power voltage $V_D$ by a reset transistor 104 to the gate of which a voltage φR is applied. Therefore, a potential (optical reception signal) corresponding to the signal charges and a reset potential (reference signal) are read as a pair into the signal $V_{sig}$.

Figure 6:
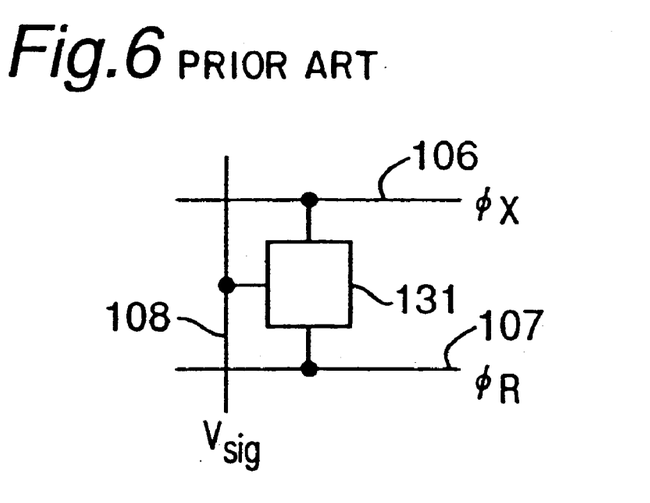
FIG. 6 is a block diagram schematically showing the above pixel element.

The pixel section of the amplification type solid-state imaging device that employs the pixel element shown in FIG. 5 can be expressed by a schematic diagram as shown in FIG. 6. In FIG. 6 is shown a pixel section 131 for executing the photoelectric conversion, amplification, read and reset. The read of the pixel section 131 is controlled by a voltage $φ_X$ of a signal line 106, and the reset of the pixel section 131 is controlled by a voltage $φ_R$ of a signal line 107. Thus, the amplified signal $V_{sig}$ is outputted from the pixel section 131 via a vertical signal line 108.

Figure 7:
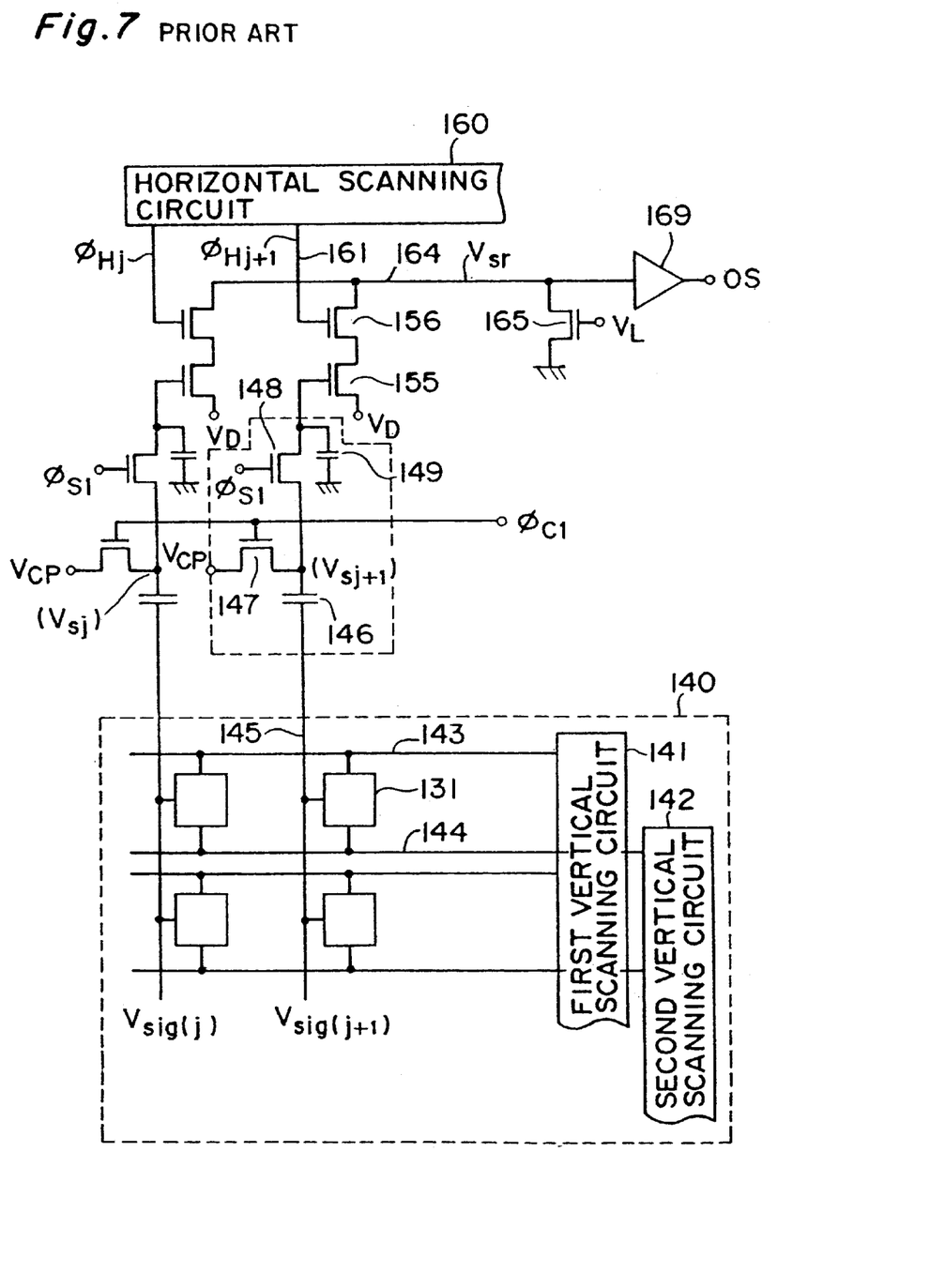
FIG. 7 is a circuit diagram of a background art amplification type solid-state imaging device.
Figure 8A:
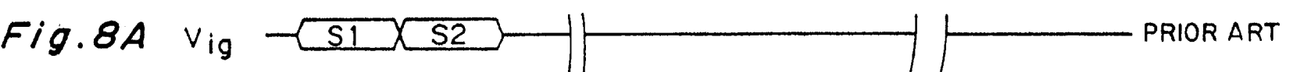
FIGS. 8A through 8G are timing charts showing the timing of the signals of the above amplification type solid-state imaging device.
Figure 8B:
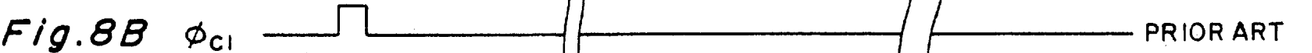
Figure 8C:
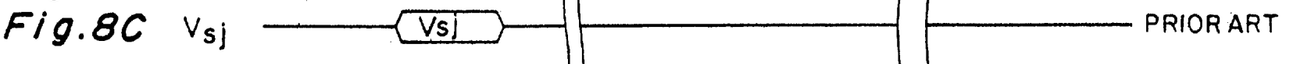
Figure 8D:
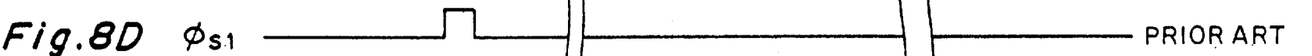
Figure 8E:
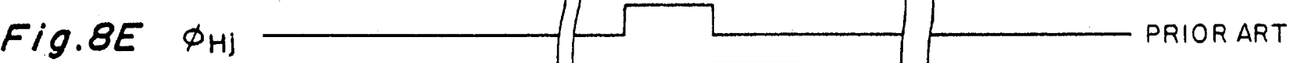
Figure 8F:
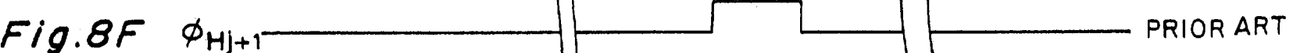
Figure 8G:
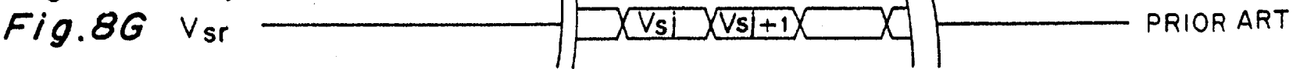

FIG. 7 is a schematic diagram of an amplification type solid-state imaging device (two-dimensional image sensor) constructed by employing the pixel section 131. In FIG. 7, a two-dimensional pixel region 140 is constituted of the pixel section 131, a first vertical scanning circuit 141 and a second vertical scanning circuit 142. The read operation of the pixel section 131 is controlled by a signal 143 from the first vertical scanning circuit 141, and the reset operation is controlled by a signal 144 from the second vertical scanning circuit 142. An output signal from the pixel section 131 is read by a vertical signal line 145 and thereafter transferred to a correlated double sampling circuit provided for each vertical signal line 145. A differential signal representing a difference between the optical reception signal obtained during read and a reference signal obtained after the reset is outputted from the correlated double sampling circuit. With regard to the differential signal, variations in the threshold value between the pixel sections 131 are canceled, so that a fixed pattern noise (hereinafter referred to as FPN) of each pixel section 131 is suppressed. It is to be noted that the correlated double sampling circuit is constituted of a clamping circuit (clamping capacitor 146 and clamping switch 147) and a sample hold circuit (sample hold switch 148 and sample hold capacitor 149).

In the aforementioned correlated double sampling circuit, the vertical signal line 145 is connected to the sample hold switch 148 via the clamping capacitor 146 and connected to the clamping potential $V_{CP}$ via the clamping switch 147.

FIGS. 8A through 8G show the operation timing of the aforementioned correlated double sampling circuit. In the clamping circuit (clamping capacitor 146 and clamping switch 147), the operation of clamping to the clamping potential $V_{CP}$ is executed by making a pulse $φ_{C1}$ have high level during read of the optical reception signal (S1) from the pixel section 131, and a differential signal $V_{sj}$ of a difference between the optical reception signal (S1) from the pixel section 131 and the reference signal (S2) is outputted from the clamping capacitor 146. The sample hold switch 148 samples the differential signal $V_{sj}$ of the difference between the optical reception signal and the reference signal. Then, the signal $V_{sj}$ from the sample hold switch 148 is held by the sample hold capacitor 149 and amplified by an amplifier circuit 155. The signal amplified by the amplifier circuit 155 is outputted as an output signal $V_{sr}$ to the horizontal signal line 164 via a horizontal selection switch 156 controlled by an output line 161 from the horizontal scanning circuit 160, and differential signals $V_{sj}$, $V_{sj+1}$, ... from the sample hold circuits are successively read. It is to be noted that the reference numeral 165 denotes a second constant current load of the amplifier circuit 155. Finally, the signal $V_{sr}$ becomes a signal OS by the operation of a buffer amplifier 169.

As described above, in the amplification type solid-state imaging device shown in FIG. 7, the FPN due to the variations in the threshold value between the pixel sections 131 is suppressed by the correlated double sampling circuit provided for each vertical signal line 145. However, in the amplification type solid-state imaging device, the amplifier circuits 155 of the vertical signal lines 145 are accompanied by variations in the offset level, gain and so on. These variations, which are random in the horizontal direction and common in the vertical direction of an image, cause a significant FPN of a vertical stripe pattern in a video image, significantly impairing the image quality.

Figure 9:
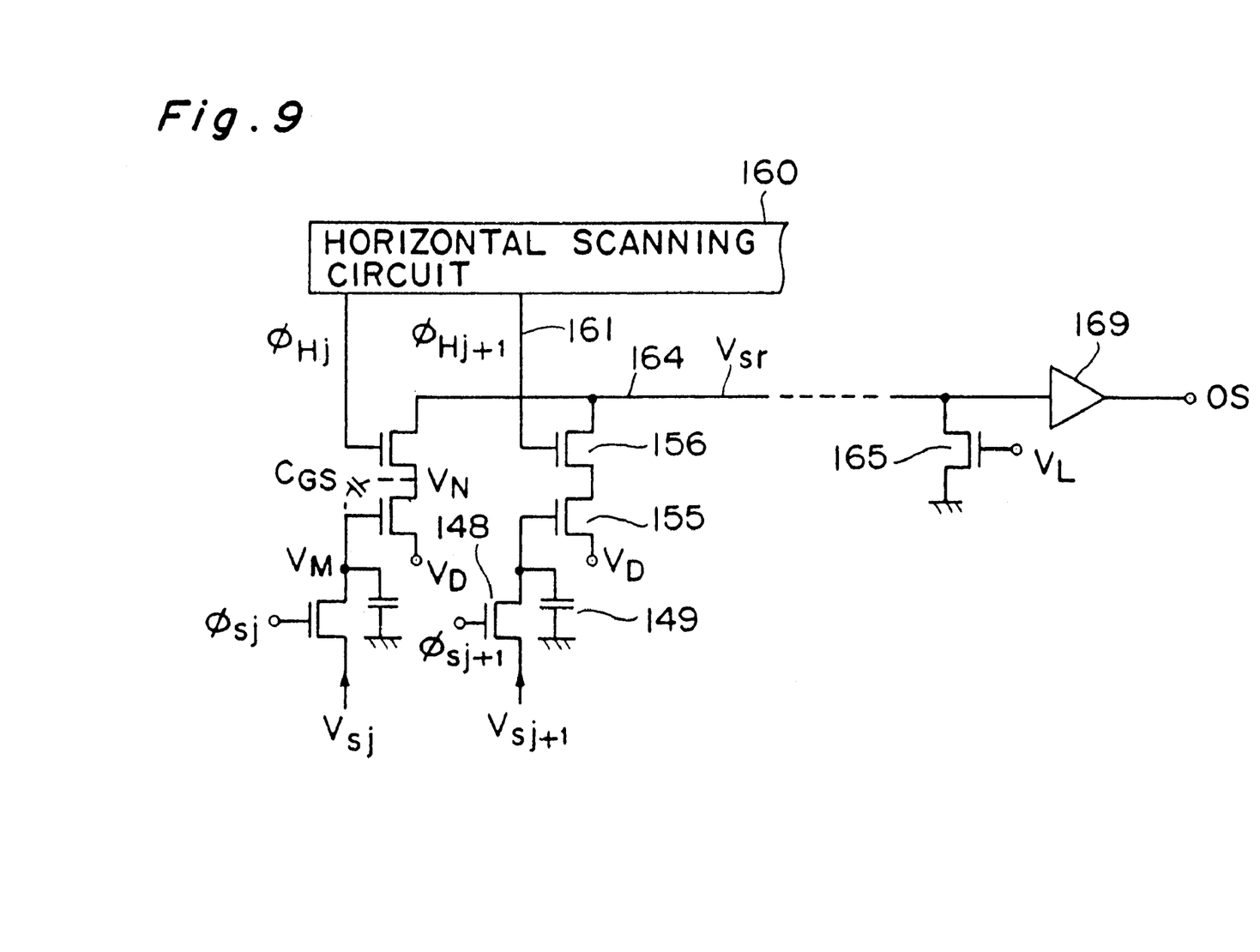
FIG. 9 is a circuit diagram of an amplification type solid-state imaging device of which the vertical stripe-shaped FPN is resolved.

Accordingly, as a method for resolving the FPN of a vertical stripe pattern described above, the present applicant has proposed an amplification type solid-state imaging device as shown in FIG. 9 (Japanese Patent Application No. 2000-49505). It is to be noted that this amplification type solid-state imaging device is described for better understanding of the present invention and is neither a known technology nor a prior art.

In this amplification type solid-state imaging device, the two-dimensional pixel region has the same construction as that of the two-dimensional pixel region 140 shown in FIG. 7, and neither of figures nor description for the two-dimensional pixel region is provided. Furthermore, in order to explain only the essential point, description is started from the output side of the clamping circuit with the detailed concrete circuit omitted.

In the case of FIG. 7, an output from the clamping circuit is only the differential signal $V_{sj}$ of the difference between the optical reception signal and the reference signal with respect to the clamping potential $V_{CP}$ that serves as a reference. This signal is sampled once by the sample hold circuit (sample hold switch 148 and sample hold capacitor 149) and transferred to the amplifier circuit 155. On the other hand, a differential signal $V_{sj}(a)$ of the difference between the optical reception signal and the reference signal is read to the output side of the clamping circuit, and thereafter a reference signal $V_{sj}(b)$ is further read in the case of FIG. 9. The clamping potential, which is usually selected as this reference signal, serves as a reference for the differential signal $V_{sj}(a)$ and is common to the columns.

Figures 10A, 10B:
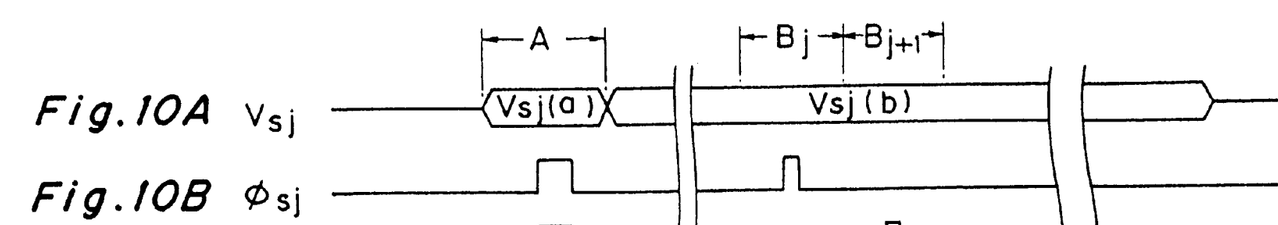
FIGS. 10A through 10F are timing charts showing the timing of the signals of the above amplification type solid-state imaging device.
Figure 10C:
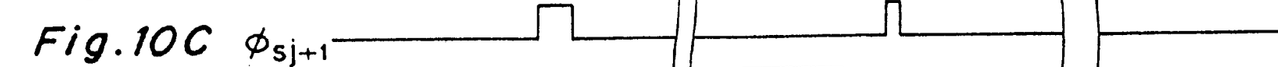
Figure 10D:
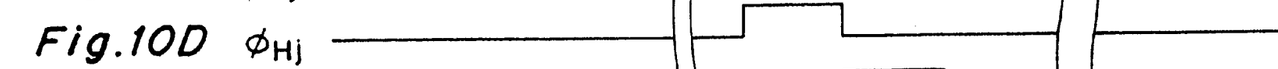
Figure 10E:
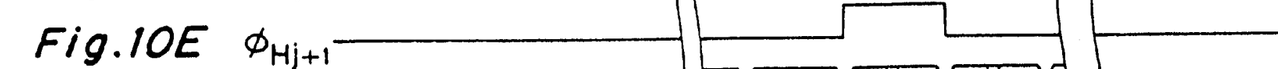
Figure 10F:
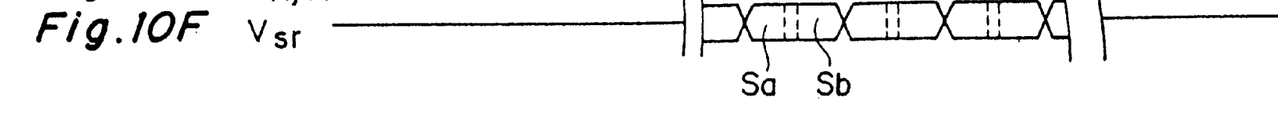

FIGS. 10A through 10F are timing charts showing the timing of the signals of the aforementioned amplification type solid-state imaging device. As shown FIGS. 10A through 10F, in the amplification type solid-state imaging device, the sample hold circuit executes the sampling operation two times. At the first time, the differential signal $V_{sj}(a)$ of the difference between the optical reception signal and the reference signal is sampled by a pulse $\phi_{sj}$, $\phi_{sj+1}$, . . . (FIGS. 10B and 10C). This is the timing common to the columns. This differential signal is applied to the gate of the amplifier circuit 155. The horizontal selection switches 156 are sequentially turned on by pulses $\phi_{Hj}$, $\phi_{Hj+1}$, . . . (FIGS. 10D and 10E) of the output line 161 from the horizontal scanning circuit 160. In the middle of each ON-state period, the sample hold circuit executes the second sampling operation as indicated by the pulse $\phi_{sj}$, $\phi_{sj+1}$, . . . . By this operation, the signal $V_{sj}(a)$, $V_{sj+1}(a)$, . . . is read in the first half of the respective ON-state period, and the reference signal $V_{sj}(b)$, $V_{sj+1}(b)$, . . . is read in the latter half. In FIG. 10F, the signal $V_{sj}(a)$, $V_{sj+1}(a)$, . . . is denoted by "Sa", while the signal $V_{sj}(b)$, $V_{sj+1}(b)$, . . . is denoted by "Sb". The signals $V_{sj}(a)$ and $V_{sj}(b)$, the signals $V_{sj+1}(a)$ and $V_{sj+1}(b)$ and so on include the same variations in the offset level, the gain and so on of the amplifier circuit 155. Therefore, if a difference between both the signals is taken through the subsequent signal processing, then the variations in the offset level, the gain and so on of the amplifier circuit 155 can be removed.

In the amplification type solid-state imaging device shown in FIG. 9, the horizontal selection switch 156 is off during the first sampling operation. Therefore, no read current flows through the amplifier circuit 155, and a potential $V_N$ across the amplifier circuit 155 and the horizontal selection switch 156 has a high potential in a floating state. This potential $V_N$ and the gate-side potential $V_M$ of the amplifier circuit 155 are coupled with each other by way of a gate-source capacitance $C_{GS}$ of the transistor of the amplifier circuit 155. Therefore, a write operation is executed in the sample hold capacitor 149 in the state shifted to the high potential during the first sampling operation.

Next, during the second sampling operation, the horizontal selection switch 156 is on. Therefore, the read current flows to the amplifier circuit 155, and the potential $V_N$ across the amplifier circuit 155 and the horizontal selection switch 156 becomes a low potential. During the second sampling operation, a write operation is executed in the sample hold capacitor 149 in the state shifted to a low potential due to the influence of the capacitance $C_{GS}$ between the aforementioned potential $V_N$ and the gate-side potential $V_M$ of the amplifier circuit 155.

For the above reasons, a potential shift that depends on the gate-source capacitance $C_{GS}$ of the transistor 155 is generated between the potentials $V_{sj}(a)$, $V_{sj+1}(a)$, . . . through the first sampling operation and the potentials $V_{sj}(b)$, $V_{sj+1}(b)$, . . . through the second sampling operation. In general, the gate-source capacitance $C_{GS}$ of the transistor 155 has a variation. Therefore, if a difference is taken between $V_{sj}(a)$ and $V_{sj}(b)$, between $V_{sj+1}(a)$ and $V_{sj+1}(a)$ or between a similar pair, this variation component disadvantageously remains, causing a problem that a new fixed pattern noise is generated.

SUMMARY OF THE INVENTION

Accordingly, the object of the present invention is to provide a sampling circuit that receives no influence of the variation in the input-output capacitance of the amplification means and a high-performance amplification type solid-state imaging device in which the occurrence of a fixed pattern noise is remarkably reduced.

In order to achieve the above object, there is provided a sampling circuit having
- a first sample hold means having a sample hold switch whose one terminal receives an input signal and a sample hold capacitor whose one terminal is connected to the other terminal of the sample hold switch,
- an amplification means connected to the other terminal of the sample hold switch, and
- an output selection switch whose one terminal is connected to an output of the amplification means and the other terminal of which is connected to an output signal line, the sampling circuit comprising:
    a first constant current load connected to an output side of the amplification means.

In one embodiment of the present invention, a conduction control switch is connected between the amplification means and the first constant load.

According to the sampling circuit of the above-mentioned embodiment, even if the sample hold switch is turned on during the period during which the output selection switch is off, the conduction control switch is on. Therefore, even if the output selection switch is off during the first sampling operation when the present invention is applied to the correlated double sampling circuit, a current flows from the amplification means to the first constant current load via the conduction control switch. During the second sampling operation, the output selection switch is on, and the conduction control switch is off. Therefore, a read current flows from the amplification means to the output signal line via the output selection switch. Therefore, the potential across the amplification means and the output selection switch is lowered during both the first and second sampling operations in the case of the correlated double sampling circuit. Even if the write potential during the sampling operation is influenced by the capacitance between the potential across the amplification means and the output selection switch and the gate-side potential of the amplification means, the potential across the amplification means and the output selection switch is the same during both the first and second sampling operations. If the difference between the two (between the signal sampled at the first time and the signal sampled at the second time) is taken, then the influence will be canceled. Therefore, even if the capacitance varies between the plurality of sample hold circuits, the capacitance exerts no influence. Therefore, the occurrence of a new fixed pattern noise is suppressed in the amplification type solid-state imaging device that employs this sampling circuit.

In one embodiment of the present invention, the conduction control switch is turned on during at least a period during which the sample hold switch is on and the output selection switch is off.

According to the sampling circuit of the above-mentioned embodiment, by turning on the conduction control switch during at least the period during which the sample hold switch is on and the output selection switch is off, a current flows from the amplification means to the first constant current load via the conduction control switch, and a read current flows from the amplification means to the output signal line via the output selection switch during the period during which the output selection switch is on. Therefore, during at least the period during which the sample hold switch is on and the output selection switch is off, the potential across the amplification means and the output selection switch can be lowered similarly to the period during which the output selection switch is on.

In one embodiment of the present invention, the sampling circuit further comprises a second constant current load connected to the output signal line.

According to the sampling circuit of the above-mentioned embodiment, by connecting the second constant current load to the output signal line, when the output selection switch is on and the conduction control switch is off, a read current flows from the amplification means to the second constant current load via the output selection switch and the output signal line. Therefore, during at least the period during which the sample hold switch is on and the output selection switch is off and during the period during which the output selection switch is on, the potential across the amplification means and the output selection switch can be lowered and brought into the same state.

In one embodiment of the present invention, the sampling circuit further comprises a first clamping means having a clamping capacitor whose one terminal is connected to an input signal line and the other terminal of which is connected to one terminal of the sample hold switch and a clamping switch whose one terminal is connected to the other terminal of the clamping capacitor and the other terminal of which is connected to a clamping potential.

According to the sampling circuit of the above-mentioned embodiment, the differential signal of the two signals of different input signal lines can be obtained by the correlated double sampling operation by the first clamping means that has the clamping capacitor and the clamping switch and the first sample hold means.

In one embodiment of the present invention, the sampling circuit further comprises:

a control means for controlling the sample hold switch, the output selection switch, the conduction control switch and the clamping switch, the control means operating to clamp in a first period either one of a pair of input signal and reference signal applied to the input signal line in a first half of the first period by means of the first clamping means, thereafter sample and hold a differential signal that represents a difference between the input signal and the reference signal and appears on an output side of the clamping capacitor by the first sample hold means in a latter half of the first period and turn on the conduction control switch during at least a period during which the first sample hold means is turned on within the first period, and operating to hold in a second period subsequent to the first period a signal on the output side of the clamping capacitor in an early stage of the second period, thereafter turn on the output selection switch during a third period within the second period, read the differential signal to the output signal line in a first half of the third period, sample and hold a constant potential signal held in the clamping capacitor by turning on the sample hold switch about in the middle of the third period, read the constant potential signal to the output signal line in a latter half of the third period and turn off the conduction control switch in the third period.

According to the sampling circuit of the above-mentioned embodiment, the input signal and the reference signal exist as a pair on the input signal line. The control means controls the sample hold switch, the output selection switch, the conduction control switch and the clamping switch so as to clamp either one of the input signal and the reference signal on the input signal line in the first half of the first period by the first clamping means, thereafter sample and hold the differential signal that is the difference between the input signal and the reference signal and appears on the output side of the clamping capacitor by the first sample hold means in the latter half of the first period, turn on the conduction control switch during at least the period during which the first sample hold means is turned on within the first period, hold the signal on the output side of the clamping capacitor to the specified potential in the early stage of the second period subsequent to the first period, thereafter read the differential signal to the output signal line in the first half of the third period during which the output selection switch is turned on within the second period, sample and hold the constant potential signal by turning on the sample hold switch about in the middle of the third period, read the constant potential signal to the output signal line in the latter half of the third period and turn off the conduction control switch in the third period.

Therefore, even if the output selection switch is off during the first sampling operation, a current flows from the amplification means to the first constant current load via the conduction control switch. During the second sampling operation, the output selection switch is on, and the conduction control switch is off. Therefore, the read current flows from the amplification means to the output signal line via the output selection switch. Therefore, the potential across the amplification means and the output selection switch is lowered during both the first and second sampling operations. If the write potential during the sampling operation is influenced by the capacitance between the potential across the amplification means and the output selection switch and the gate-side potential of the amplification means, the potential across the amplification means and the output selection switch is in the same state during both the first and second sampling operations. If the difference between the two (between the signal sampled at the first time and the signal sampled at the second time) is taken, then the influence can be canceled.

In one embodiment of the present invention, the sampling circuit further comprises:

a second clamping means for outputting a difference signal of a difference between the differential signal and the constant potential signal by clamping the differential signal on the basis of the differential signal read to the output signal line and the constant potential signal; and a second sample hold means for sampling and holding the difference signal from the second clamping means and outputting the difference signal that is sampled and held.

According to the sampling circuit of the above-mentioned embodiment, with the construction of the second clamping circuit and the second sample hold circuit, the difference signal of the differential signal of the pair of signals read to the horizontal signal line and the constant potential signal is obtained. In the amplification type solid-state imaging device that employs this sampling circuit, a signal that represents an image from which all the variation components are removed and is free from FPN can be obtained.

Also, there is provided an amplification type solid-state imaging device provided with an amplification type pixel element, which amplifies an optical reception signal formed by a photoelectric conversion means and a reference signal that serves as a reference for the optical reception signal, wherein the sampling circuit is employed by connecting the output of the pixel element to the input signal line, using the optical reception signal outputted from the pixel element as an input signal and using the reference signal outputted from the pixel element as a reference signal.

According to the amplification type solid-state imaging device of the above-mentioned construction, by sampling and holding the differential signal of the difference between the input signal and the reference signal in the first period by the first sample hold means and turning on the conduction control switch during at least the period during which the first sample hold means is turned on within the first period with the optical reception signal of the pixel element made to serve as an input signal and with the reference signal made to serve as the reference signal, a current flows from the amplification means to the first constant current load via the conduction control switch even if the output selection switch is off during the first sampling operation. The signal on the output side of the clamping capacitor is held at the specified potential in the early stage of the second period subsequent to the first period, and the differential signal is thereafter read to the output signal line in the first half of the third period during which the output selection switch is turned on within the second period. The constant potential signal is sampled and held by turning on the sample hold switch about in the middle of the third period, and the constant potential signal is read to the output signal line in the latter half of the third period. During this second sampling operation, the output selection switch is on, and the conduction control switch is off. Therefore, the read current flows through the output signal line from the amplification means via the output selection switch. Therefore, during both the first and second sampling operations, the potential across the amplification means and the output selection switch is lowered. Even if the write potential during the sampling operation is influenced by the capacitance between the potential across the amplification means and the output selection switch and the gate-side potential of the amplification means, the potential across the amplification means and the output selection switch is the same during both the first and second sampling operations. If the difference between the two (between the signal sampled at the first time and the signal sampled at the second time) is taken, then the influence will be canceled. Therefore, even if the capacitance varies between the plurality of sample hold circuits, there is no influence of the capacitance. Therefore, the occurrence of a new fixed pattern noise is suppressed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The sampling circuit and the amplification type solid-state imaging device that employs the circuit will be described in detail below on the basis of the embodiments shown in the drawings.

(First Embodiment)

Figure 1:
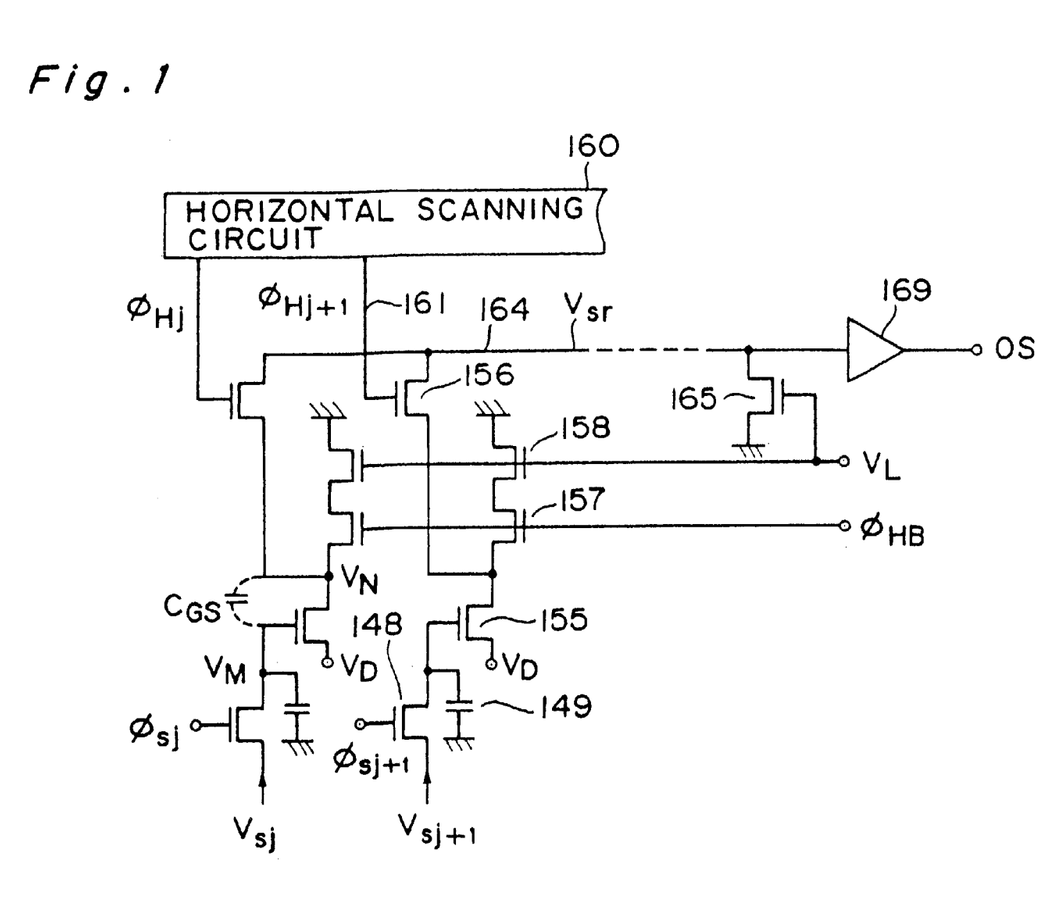
FIG. 1 is a circuit diagram of the essential part of an amplification type solid-state imaging device that employs a sampling circuit according to a first embodiment of the present invention.

FIG. 1 is a circuit diagram of the essential part of the amplification type solid-state imaging device that employs a sampling circuit according to the first embodiment of the present invention. FIGS. 2A through 2G are timing charts showing the timing of the signals of the above-mentioned sampling circuit. It is to be noted that FIG. 1 shows only two columns out of a plurality of columns.

As shown in FIG. 1, in the amplification type solid-state imaging device, a sample hold switch 148 whose one terminal receives input signals $V_{sj}$, $V_{sj+1}$, ... has the other terminal connected to an input terminal of an amplifier circuit 155 that serves as an amplification means. A pulse $\phi_{sj}$, $\phi_{sj+1}$, ... is inputted to a control input terminal of the sample hold switch 148. An output terminal of the amplifier circuit 155 is connected to a horizontal signal line 164 that serves as an output signal line via a horizontal selection switch 156 that serves as an output selection switch, and an output line 161 from the horizontal scanning circuit 160 is connected to the control input terminal of the horizontal selection switch 156. Further, a first constant current load 158 is connected to the output terminal of the amplifier circuit 155 via a conduction control switch 157, and a control signal $\phi_{HB}$ is inputted to the control input terminal of the conduction control switch 157. Moreover, a second constant current load 165 is connected across the horizontal signal line 164 and the ground GND. A voltage $V_L$ is inputted to the control input terminals of the first and second constant current loads 158 and 165. Moreover, an input terminal of a buffer amplifier 169 is connected to the terminal end of the horizontal signal line 164, and a signal OS is outputted from the buffer amplifier 169. A sample hold circuit that serves as a first sample hold means is constituted of the sample hold switch 148 and the sample hold capacitor 149.

Figure 2A:
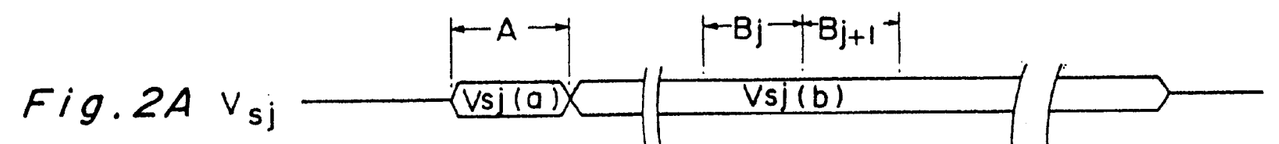
FIGS. 2A through 2G are timing charts showing the timing of the signals of the above sampling circuit.
Figure 2B:
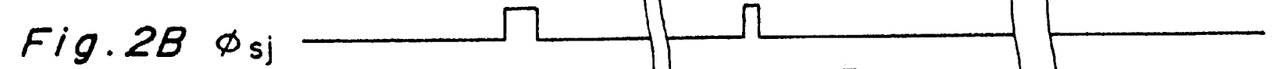
Figure 2C:
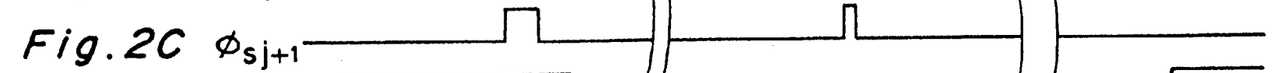
Figures 2D, 2E:
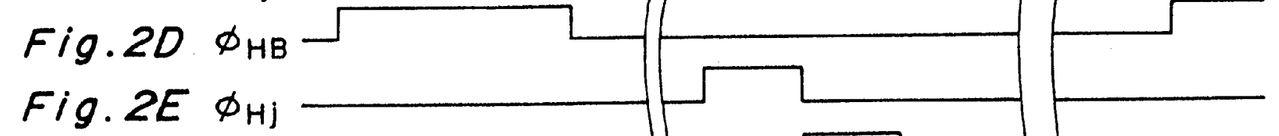
Figure 2F:
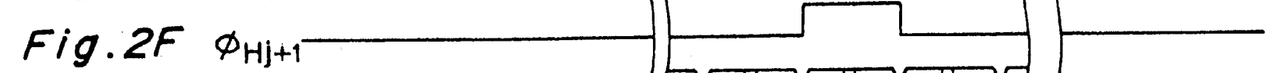
Figure 2G:
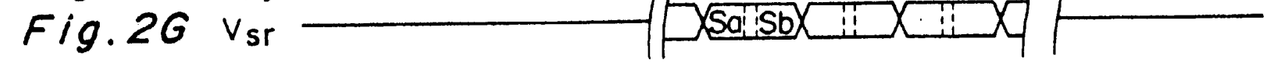

In the amplification type solid-state imaging device that employs the sampling circuit of the above-mentioned construction, the sample hold circuit (sample hold switch 148 and sample hold capacitor 149) executes a sampling operation two times as shown in FIGS. 2A through 2G, similarly to the case of the amplification type solid-state imaging device of FIG. 9 and FIGS. 10A through 10F. At the first time, a first signal $V_{sj}(a)$ is sampled during a period A by the pulse $\phi_{sj}$, $\phi_{sj+1}$, . . . (FIGS. 2B and 2C). This is the timing common to the columns. This first signal is applied to the gate of the amplifier circuit 155. The horizontal selection switches 156 are sequentially turned on by pulses $\phi_{Hj}$, $\phi_{Hj+1}$, . . . (FIGS. 2E and 2F) of the output line 161 from the horizontal scanning circuit 160. In the middle of each ON-state period $B_j$, $B_{j+1}$, . . . , the sample hold circuit executes the second sampling operation as indicated by the pulse $\phi_{sj}$, $\phi_{sj+1}$, . . . . By this operation, the signal $V_{sj}(a)$, $V_{sj+1}(a)$, . . . is read in the first half of each ON-state period $B_j$, $B_{j+1}$, . . . , and the second signal $V_{sj}(b)$, $V_{sj+1}(b)$, . . . is read in the latter half of each ON-state period $B_j$, $B_{j+1}$, . . . . In FIGS. 2A and 2G, the signal $V_{sj}(a)$, $V_{sj+1}(a)$, . . . is denoted by "Sa", while the signal $V_{sj}(b)$, $V_{sj+1}(b)$, . . . is denoted by "Sb".

In the sampling circuit, the signals $V_{sj}(a)$ and $V_{sj}(b)$, the signals $V_{sj+1}(a)$ and $V_{sj+1}(b)$ and so on include the same variations in the offset level, the gain and so on of the amplifier circuits 155. Therefore, if a difference between both signals is taken through the subsequent signal processing, then the variations in the offset level, the gain and so on of the amplifier circuit 155 can be removed.

The sample hold circuit (sample hold switch 148 and sample hold capacitor 149) shown in FIG. 1 differs from the sample hold circuit shown in FIG. 9 in the following points. That is, the circuit shown in FIG. 1 is constructed so that the output side of the amplifier circuit 155 is diverged into one branch led to the horizontal selection switch 156 and the other branch connected to the first constant current load 158 via the conduction control switch 157. The control signal $\phi_{HB}$ is applied to the conduction control switch 157.

As shown in FIGS. 2A through 2G, even if the horizontal selection switch 156 driven by the pulse $\phi_{Hj}$, $\phi_{Hj+1}$, . . . is off during the first sampling operation, the conduction control switch 157 driven by the control signal $\phi_{HB}$ is on. Therefore, a current flows from the amplifier circuit 155 to the first constant current load 158 via the conduction control switch 157. Next, during the second sampling operation, the horizontal selection switch 156 is on and the conduction control switch 157 is off. Therefore, a read current flows from the amplifier circuit 155 to the second constant current load 165 via the horizontal selection switch 156. Therefore, during both the first and second sampling operations, the potential $V_N$ across the amplifier circuit 155 and the horizontal selection switch 156 is lowered.

Even if the write potential during the sampling operation is influenced by a capacitance $C_{GS}$ between the potential $V_N$ and the gate-side potential $V_M$ of the amplifier circuit 155, the potential $V_N$ is in the same state during both the first and second sampling operations. If a difference between the two (between $V_{sj}(a)$ and $V_{sj}(b)$ and between $V_{sj+1}(a)$ and $V_{sj+1}(b)$) is taken, then the influence is canceled. Therefore, even if the capacitance $C_{GS}$ varies between the plurality of sample hold circuits, there occurs no influence. Therefore, if this sampling circuit is employed in an amplification type solid-state imaging device, then the occurrence of a new fixed pattern noise can be suppressed.

(Second Embodiment)

Figure 3:
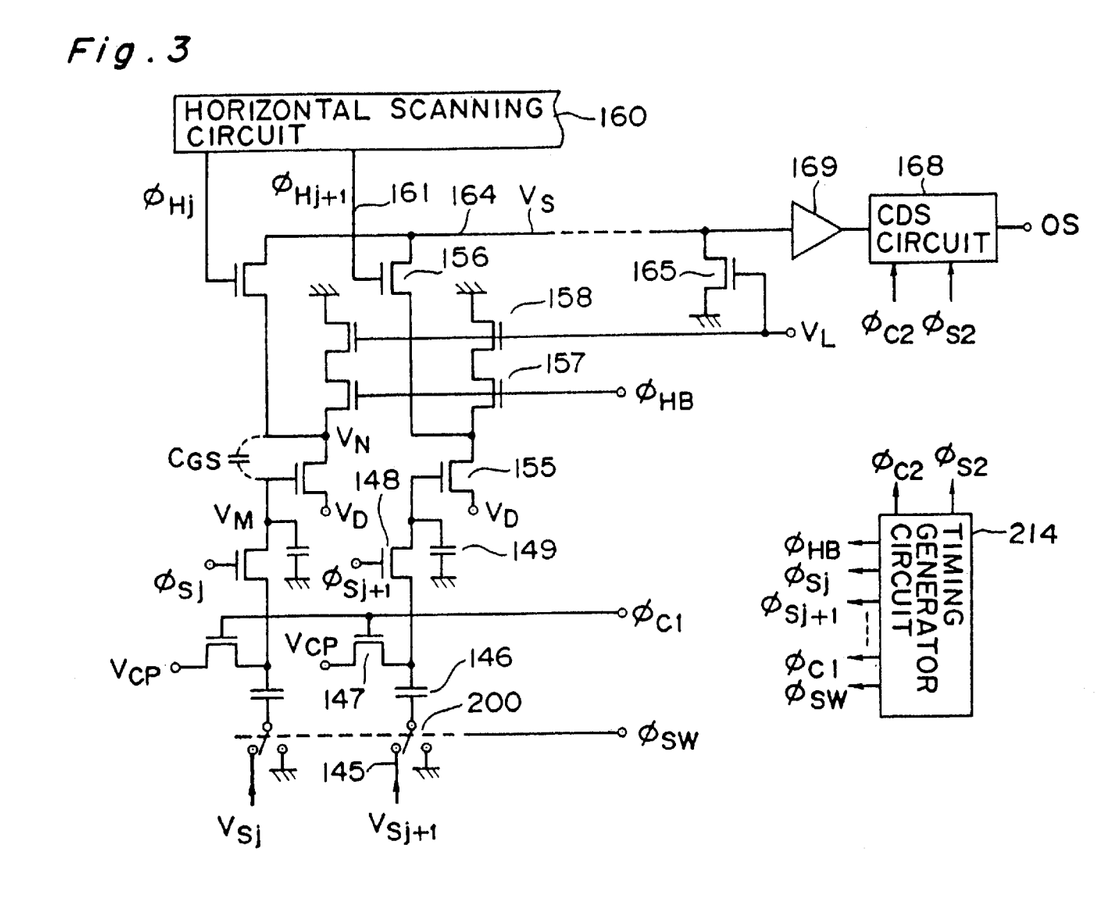
FIG. 3 is a circuit diagram of the essential part of an amplification type solid-state imaging device that employs a sampling circuit according to a second embodiment of the present invention.

FIG. 3 is a circuit diagram of the amplification type solid-state imaging device that employs a sampling circuit according to the second embodiment of the present invention. FIGS. 4A through 4L are timing charts showing the timing of the signals of the above-mentioned amplification type solid-state imaging device. In this case, a two-dimensional pixel region has the same construction as that of the two-dimensional pixel region 140 shown in FIG. 7. There is provided neither of figures nor description for the two-dimensional pixel region, and the stages subsequent to the vertical signal line 145 that serves as an input signal line will be described.

As shown in FIG. 3, a correlated double sampling circuit is constructed by inserting a first clamping means on the input side of the sampling circuit shown in FIG. 1. That is, the circuit is provided with an input changeover switch 200 whose one input terminal is connected to the input signal line 145 and the other input terminal of which is connected to the ground GND that has a fixed potential, a clamping capacitor 146 whose one terminal is connected to the output terminal of the input changeover switch 200 and a clamping switch 147 whose one terminal is connected to the other terminal of the clamping capacitor 146 and the other terminal of which is connected to the clamping potential $V_{CP}$ that has a constant potential. The input side of the sampling circuit shown in FIG. 1 is connected to the other terminal of the clamping capacitor 146. A first clamping means is constituted of the clamping capacitor 146 and the clamping switch 147. The amplification type solid-state imaging device is provided with a timing generator circuit 214 that serves as a control means for generating drive pulses ($\phi_{SW}$, $\phi_{C1}$, $\phi_{Sj}$, $\phi_{Sj+1}$, $\phi_{HB}$, etc.). Further, a second CDS (correlated double sampling) circuit 168 is provided at the terminal end of the horizontal signal line 164.

Figure 11:
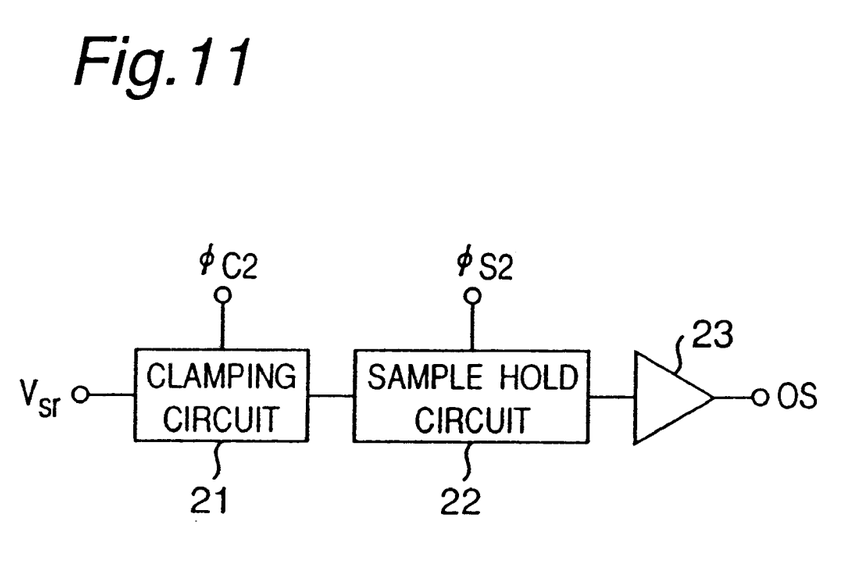
FIG. 11 is a block diagram of a CDS circuit obtained by combining a clamping circuit with a sample hold circuit.

FIG. 11 shows an example of the construction of the CDS circuit 168 of FIG. 3. The CDS circuit 168 is provided with a clamping circuit 21 that serves as a second clamping means to which a signal $V_{sr}$ is inputted, a sample hold circuit 22 that serves as a second sample hold means and a buffer amplifier 23. By controlling the clamping circuit 21 with a clamping pulse $\phi_{C2}$ and controlling the sample hold circuit 22 with a sample hold pulse $\phi_{S2}$, a difference between the first signal Sa and the second signal Sb can be obtained by the clamping pulse $\phi_{C2}$ and the sample hold pulse $\phi_{S2}$, and the signal OS is outputted via the buffer amplifier 23.

In the amplification type solid-state imaging device of the above-mentioned construction, first of all, by making the pulse $\phi_{SW}$ (FIG. 4B) have high level during the first period (FIG. 4A), the input changeover switch 200 is connected to the vertical signal line 145. On the vertical signal line 145, an optical reception signal is obtained as a signal S1 in the first half of the first period, and a reference signal is obtained as a reference signal S2 in the latter half. As indicated by the pulse $\phi_{C1}$ (FIG. 4C), the clamping circuit (clamping switch 147 and clamping capacitor 146) clamps the signal S1 to obtain a differential signal (differential signal+clamping potential $V_{CP}$) of a difference between the optical reception signal S1 and the reference signal S2 in the latter half of the first period. This corresponds to the first signal $V_{sj}(a)$ in the case of FIG. 1.

Next, during the second period, by making the pulse $\phi_{SW}$ have low level, the input changeover switch 200 is connected to the ground GND that has a fixed potential. By turning on the clamping switch 147 at the beginning of the second period, the potential $V_{CP}$ is retained on the output side of the clamping capacitor 146. This signal corresponds to the second signal $V_{sj}(b)$ in the case of FIG. 1.

Figure 4A:
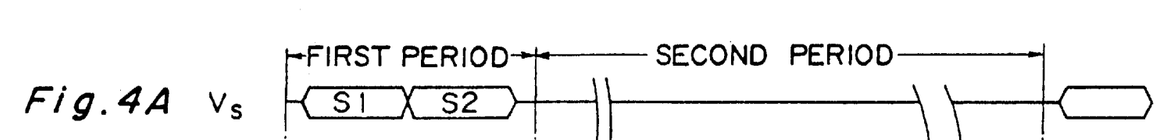
FIGS. 4A through 4L are timing charts showing the timing of the signals of the above amplification type solid-state imaging device.
Figure 4B:
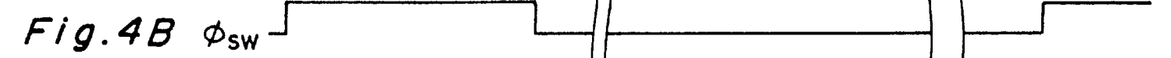
Figure 4C:
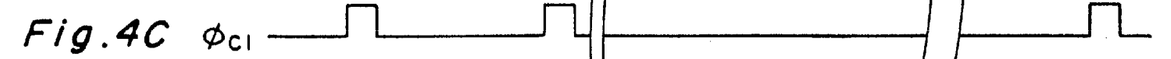
Figure 4D:
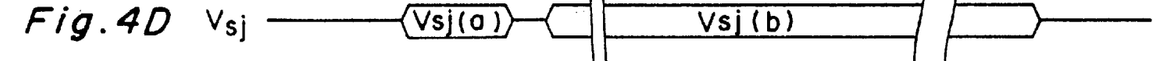
Figure 4E:
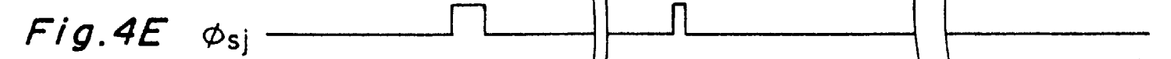
Figure 4F:
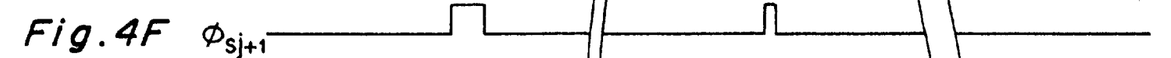
Figures 4G, 4H:
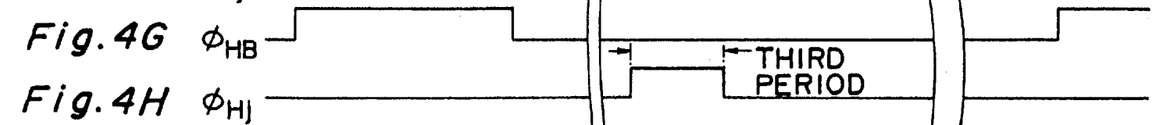
Figure 4I:
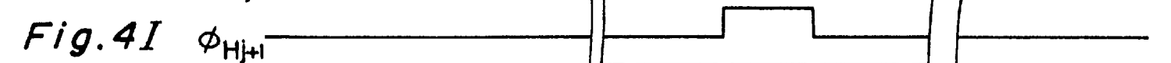
Figure 4J:
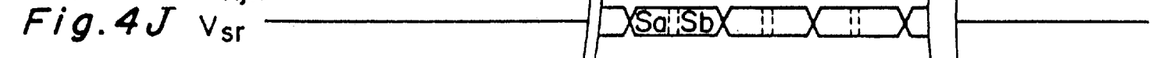
Figure 4K:
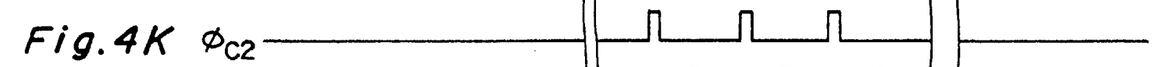
Figure 4L:
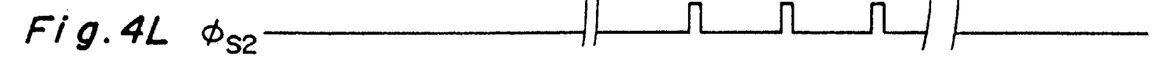

In FIGS. 3 and 4A through 4L, the sample hold circuit (sample hold switch 148 and sample hold capacitor 149) executes a sampling operation two times, similarly to the case of FIGS. 1 and 2A through 2G. At the first time, the first signal $V_{sj}(a)$ is sampled by the pulse $\phi_{sj}, \phi_{sj+1}, \ldots$ (FIGS. 4E and 4F). This is the timing common to the columns. This first signal is applied to the gate of the amplifier circuit 155. The horizontal selection switches 156 are sequentially turned on by the pulses $\phi_{Hj}, \phi_{Hj+1}, \ldots$ (FIGS. 4H and 4I) of the output line 161 from the horizontal scanning circuit 160. In the middle of each ON-state period, the sample hold circuit executes the second sampling operation as indicated by the pulse $\phi_{sj}, \phi_{sj+1}, \ldots$. By this operation, the signal $V_{sj}(a)$, $V_{sj+1}(a)$, ... is read in the first half of each ON-state period, and the second signal $V_{sj}(b)$, $V_{sj+1}(b)$, ... is read in the latter half of each ON-state period. In FIGS. 4D and 4J, the signal $V_{sj}(a)$, $V_{sj+1}(a)$ ... is denoted by "Sa", while the signal $V_{sj}(b)$, $V_{sj+1}(b)$, ... is denoted by "Sb".

In the above-mentioned amplification type solid-state imaging device, the signals $V_{sj}(a)$ and $V_{sj}(b)$, the signals $V_{sj+1}(a)$ and $V_{sj+1}(b)$ and so on include the same variations in the offset level, the gain and so on of the amplifier circuits 155. Therefore, if a difference between both signals is taken by the subsequent second CDS circuit 168, then the variations in the offset level, the gain and so on of the amplifier circuit 155 can be removed. That is, the CDS circuit 168 can obtain the difference between the first signal Sa and the second signal Sb by clamping the first signal Sa with the clamping pulse $\phi_{C2}$ (FIG. 4K) of the second clamping circuit 21 (shown in FIG. 11) that serves as a second clamping means and sampling and holding the second signal Sb with the sample hold pulse $\phi_{S2}$ (FIG. 4L) of the second sample hold circuit 22 (shown in FIG. 11) that serves as a second sample hold means.

Also in FIG. 3, similarly to FIG. 1, the output side of the amplifier circuit 155 is diverged into one branch led to the horizontal selection switch 156 and the other branch connected to the first constant current load 158 via the conduction control switch 157. The control signal $\phi_{HB}$ is applied to the conduction control switch 157. Therefore, even if the horizontal selection switch 156 driven by the pulse $\phi_{Hj}$, $\phi_{Hj+1}$, ... is off during the first sampling operation, the conduction control switch 157 driven by the control signal $\phi_{HB}$ (FIG. 4G) is on. Therefore, a current flows from the amplifier circuit 155 to the first constant current load 158 via the conduction control switch 157. Next, during the second sampling operation, the conduction control switch 157 is off when the horizontal selection switch 156 is on. Therefore, a read current flows from the amplifier circuit 155 to the second constant current load 165 via the horizontal selection switch 156. Therefore, during both the first and second sampling operations, the potential $V_N$ across the amplifier circuit 155 and the horizontal selection switch 156 is lowered.

Even if the write potential during the sampling operation is influenced by the capacitance $C_{GS}$ between the potential $V_N$ and the gate-side potential $V_M$ of the amplifier circuit 155, the same state is established during both the first and second sampling operations (i.e., the potential $V_N$ is low in either case). Therefore, if a difference between the two (between the signals $V_{sj}(a)$ and $V_{sj}(b)$ and between the signals $V_{sj+1}(a)$ and $V_{sj+1}(b)$, etc.) is taken, then the influence is canceled. Therefore, even if the capacitance $C_{GS}$ varies between the plurality of sample hold circuits, there occurs no influence. Therefore, the occurrence of a new fixed pattern noise is suppressed.

The amplification type solid-state imaging devices that employ the sampling circuits have been described in connection with the first and second embodiments. However, without being limited to the amplification type solid-state imaging device, the sampling circuit of the present invention may, of course, be applied to another device.

As is apparent from the above, according to the sampling circuit and the amplification type solid-state imaging device that employs the circuit of the present invention, with the construction in which the variations in the reading and amplifying means are removed by reading the input signal and the reference signal through the two sample hold operations and taking a difference between both the signals, a load current can be flowed from the output of the amplification means during both the two sample hold operations, so that the two sample hold operations can be made equivalent to each other. With this arrangement, even if the input-output capacitance of the amplification means varies between a plurality of sample hold circuits, the influence is equal and canceled through the two sample hold operations. In the amplification type solid-state imaging device that employs this sampling circuit, the occurrence of a new fixed pattern noise is suppressed.

Moreover, in the present invention, the first constant current load is to be newly added to each column. The current of this first constant current load is controlled by the conduction control switch, and the period during which the current flows is limited to a specified rate of, for example, about the horizontal blanking interval in the amplification type solid-state imaging device. Therefore, the increase in consumption of power is a little.

For the above reasons, the practical effect of the present invention is extremely large.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A sampling circuit having
   a first sample hold means having a sample hold switch whose one terminal receives an input signal and a sample hold capacitor whose one terminal is connected to the other terminal of the sample hold switch,
   an amplification means connected to the other terminal of the sample hold switch, and
   an output selection switch whose one terminal is connected to an output of the amplification means and the other terminal of which is connected to an output signal line, the sample circuit comprising:
   a first constant current load connected to an output side of the amplification means, and
   a first clamping means having a first clamping capacitor whose one terminal is connected to an input signal line and the other terminal of which is connected to one terminal of the sample hold switch and a clamping switch whose one terminal is connected to the other terminal of the clamping capacitor and the other terminal of which is connected to a clamping potential.

2. A sampling circuit as claimed in claim 1, comprising:
   a control means for controlling the sample hold switch, the output selection switch, the conduction control switch and the clamping switch,
   the control means operating to
      clamp in a first period either one of a pair of input signal and reference signal applied to the input signal line in a first half of the first period by means of the first clamping means, thereafter sample and hold a differential signal that represents a difference between the input signal and the reference signal and appears on an output side of the clamping capacitor by the first sample hold means in a latter half of the first period and turn on the conduction control switch during at least a period during which the first sample hold means is turned on within the first period, and operating to hold in a second period subsequent to the first period a signal on the output side of the clamping capacitor in an early stage of the second period, thereafter turn on the output selection switch during a third period within the second period, read the differential signal to the output signal line in a first half of the third period, sample and hold a constant potential signal held in the clamping capacitor by turning on the sample hold switch about in the middle of the third period, read the constant potential signal to the output signal line in a latter half of the third period and turn off the conduction control switch in the third period.

3. A sampling circuit as claimed in claim 2, comprising:

a second clamping means for outputting a difference signal of a difference between the differential signal and the constant potential signal by clamping the differential signal on the basis of the differential signal read to the output signal line and the constant potential signal; and a second sample hold means for sampling and holding the difference signal from the second clamping means and outputting the difference signal that is sampled and held.

4. An amplification type solid-state imaging device provided with an amplification type pixel element, which amplifies an optical reception signal formed by a photoelectric conversion means and a reference signal that serves as a reference for the optical reception signal, wherein the sampling circuit claimed in claim 2 is employed by connecting the output of the pixel element to the input signal line, using the optical reception signal outputted from the pixel element as an input signal and using the reference signal outputted from the pixel element as a reference signal.

* * * * *